United States Patent [19]
Heine et al.

[11] Patent Number: 5,949,304
[45] Date of Patent: Sep. 7, 1999

[54] MULTILAYER CERAMIC PACKAGE WITH FLOATING ELEMENT TO COUPLE TRANSMISSION LINES

[75] Inventors: David R. Heine; Gary Shapiro, both of Albuquerque, N.Mex.

[73] Assignee: Motorola, Inc., Schaumburg, Ill.

[21] Appl. No.: 08/953,027

[22] Filed: Oct. 16, 1997

[51] Int. Cl.⁶ .................................................. H03H 7/00
[52] U.S. Cl. ..................... 333/175; 333/177; 333/202
[58] Field of Search .................................. 333/175, 177, 333/185, 202, 204, 219

[56] References Cited

U.S. PATENT DOCUMENTS

| | | | |
|---|---|---|---|
| 5,075,650 | 12/1991 | Okamura et al. | 333/177 |
| 5,140,497 | 8/1992 | Kato et al. | 361/321 |
| 5,357,227 | 10/1994 | Tonegawa et al. | 333/185 |
| 5,373,271 | 12/1994 | Hirai et al. | 333/205 |
| 5,404,118 | 4/1995 | Okamura et al. | 333/175 |
| 5,448,209 | 9/1995 | Hirai et al. | 333/204 |
| 5,499,005 | 3/1996 | Gu et al. | 333/246 |
| 5,521,564 | 5/1996 | Kaneko et al. | 333/175 |

*Primary Examiner*—Seungsook Ham
*Attorney, Agent, or Firm*—Gary J. Cunningham; Brian M. Mancini; William E. Koch

[57] ABSTRACT

A multilayer ceramic package (200) with a floating element (202) to couple transmission lines (214) is disclosed. The package (200) has numerous dielectric layers (204A–204I) including an input electrode (206), an output electrode (208), a top ground plane (210) and a bottom ground plane (212). Transmission lines (214) are formed on some of the dielectric layers (204A–204I). Floating element (202) adjusts the electrical coupling between the transmission lines (214) and is spatially separated therefrom. This may provide the advantage of increased capacitive coupling between transmission line resonator structures in a multilayer packages, including non-adjacent resonant structures, without increasing the overall dimensions of the package (200). The floating element (202) may also increase the operable passband of a multilayer bandpass filter or provide a low-side transmission zero.

17 Claims, 6 Drawing Sheets

MULTILAYER CERAMIC PACKAGE WITH FLOATING ELEMENT TO COUPLE TRANSMISSION LINES

FIELD OF THE INVENTION

This invention relates to multilayer ceramic packages, and more particularly, to a multilayer ceramic package with a floating element to couple transmission lines.

BACKGROUND OF THE INVENTION

The use of transmission lines to propagate electrical signals through multilayer ceramic packages is well known in the art. It is also well known that the electrical coupling between transmission lines may be somewhat controlled by the design of the multilayer package. Thus, design engineers take advantage of a variety of coupling techniques when they design multilayer packages, such as bandpass filters, for example.

One common coupling technique involves coupling through the proximity of the transmission lines themselves. Although coupling may be increased by moving the transmission lines closer together, practical limits may be reached due to variations in the tolerances by which transmission lines may be placed on ceramic substrates. In fact, it is not unusual to require at least a 10 mil gap (0.010 inches) due to print limitations. Other coupling techniques, such as those requiring broadside, adjacent, and alternate layer transmission lines have all been discussed in the prior art.

In a ceramic multilayer package filter design, another way to increase coupling involves incorporating a stacked coupling capacitor in the form of a printed pad between the transmission line resonators. Unfortunately, this adds both size and complexity to the filter design.

Another well known design technique involves interleaving the transmission line resonator coils so that they are overlapped on alternate layers of the multilayer ceramic package. While this technique concededly increases coupling between the resonators, it is an approach which is not very flexible and cannot be applied to non-adjacent resonators.

FIG. 1 shows a multilayer ceramic package 100 having internal transmission lines in accordance with the prior art. Referring to FIG. 1, the multilayer package is made from a series of sheets of ceramic 102 having printed transmission lines 104 printed thereon. The transmission lines 104 are connected through the package by a set of conductively coated via holes (not shown) through the sheets of ceramic 102 which interconnect the printed patterns on each layer of the package. The alignment of the vias connecting the transmission lines are shown as dashed lines 106 in FIG. 1. Significantly, the method by which the transmission lines are coupled in FIG. 1 includes a combination of broadside or proximity coupling and alternate layer coupling. It should be noted that there are no floating elements to adjust the coupling between the transmission lines in FIG. 1.

Other methods of adjusting coupling including adding external components, such as wires, chips, capacitors, or inductors to the package. However, these techniques are seldom practical alternatives for large scale, large volume manufacturing operations.

The above discussion of transmission line coupling techniques should make it clear that it is frequently difficult to get the proper coupling between transmission line resonators formed in multilayer ceramic packages. Proper coupling becomes increasingly important for many radio frequency (RF) component designs such as lowpass filters (LPF), bandpass filters (BPF), voltage controlled oscillators (VCO), directional couplers, and the like.

Thus, a floating coupling element which may be used to adjust the coupling between the transmission line structures, and which, for example, may be used to increase the capacitive coupling between transmission line resonator structures in a multilayer package, including non-adjacent resonant structures, without increasing the overall dimensions of the packages, and which increases the operable passband of multilayer bandpass filter or provides a low-side transmission zero, and which is not directly connected to any other metallized pattern including transmission lines, ground planes, or input and output ports would be considered an improvement in the art.

DETAILED DESCRIPTION OF A PREFERRED EMBODIMENT

Figure 1:
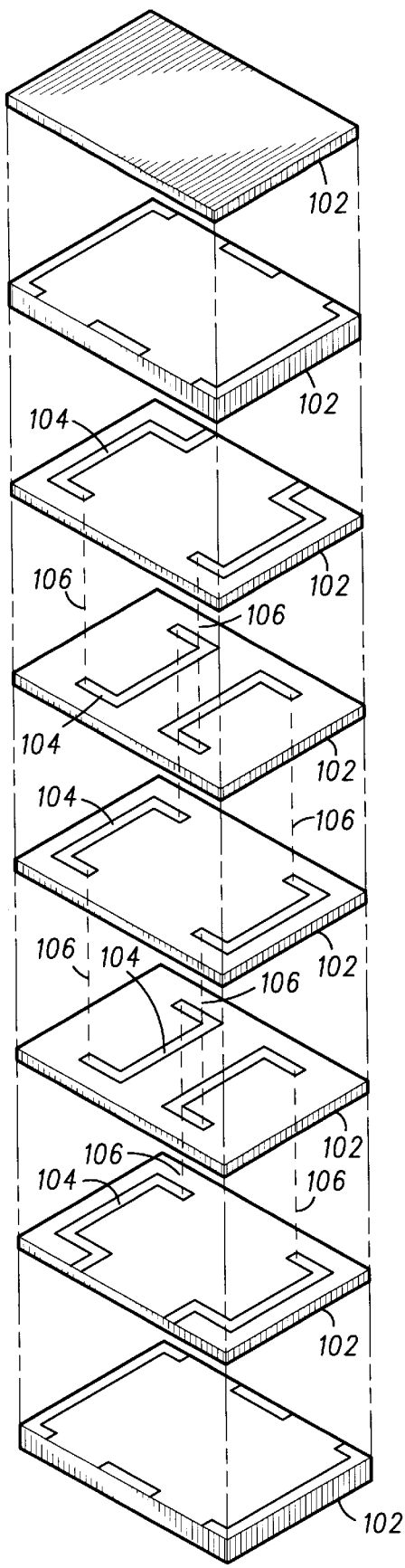
FIG. 1 shows a multilayer ceramic package having internal transmission lines in accordance with the prior art.
Figure 2:
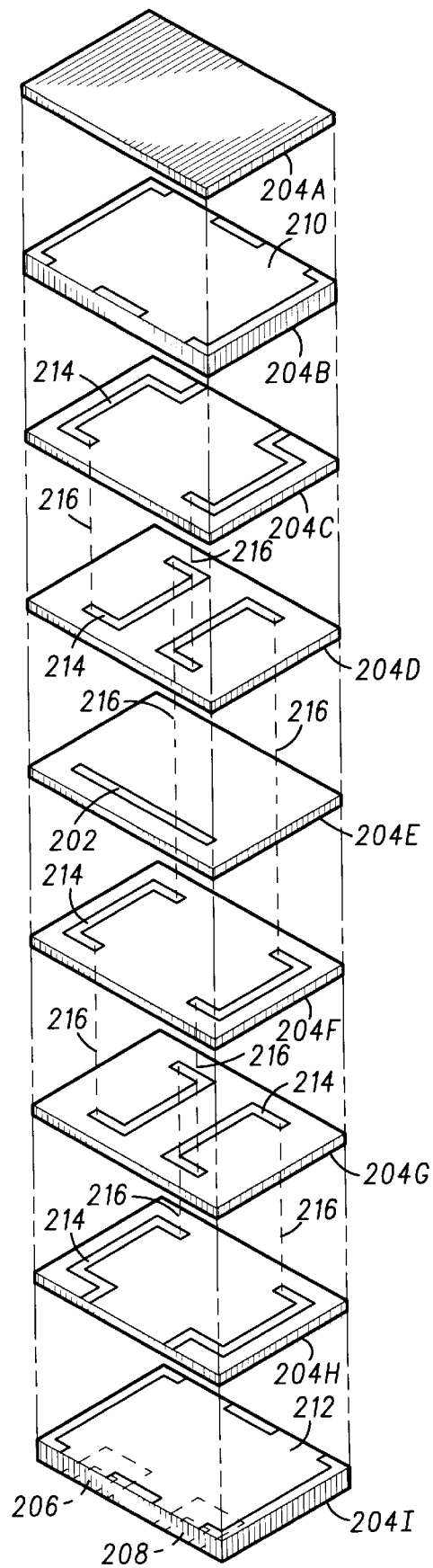
FIG. 2 shows one embodiment of a multilayer ceramic package with a floating element to couple transmission lines in accordance with the present invention.

FIG. 2 shows one embodiment of a multilayer ceramic package 200 wherein a floating element 202 to adjust the coupling between the transmission lines 214 is provided. Referring to FIG. 2, a multilayer ceramic package 200 having a series of dielectric ceramic layers labeled 204A through 204I respectively is provided. An input electrode 206 is formed on a bottom surface of one of the dielectric layers 204I. An output electrode 208 is also formed on a bottom surface of dielectric layer 204I. Additionally, a top ground plane 210 is formed on a surface of dielectric layer 204B and a bottom ground plane 212 is formed on a surface of dielectric layer 204I.

Transmission lines 214 are strategically placed on the layers inside the multilayer ceramic package 200. The transmission lines may also be referred to as electrodes formed on the dielectric ceramic layers 204A–204H. A series of through holes (not shown) are typically punched into the dielectric layers 204A–204I and metallized with a conductive material to connect the transmission lines 214. The through holes are not shown in the figures as they would unnecessarily complicate the figures and are not needed to understand the present invention. Moreover, dashed lines 216 show where the transmission lines are interconnected between adjacent layers of dielectric ceramic.

In FIG. 2, the transmission lines 214 are printed in a substantially helical pattern (quasi-helical pattern) beginning on layer 204H and extending through layer 204C to form a pair of resonant structures which provide a two pole bandpass filter. A floating element 202 is provided on layer 204E to adjust the electrical coupling between the transmission lines 214. The floating element 202 is spatially separated from the plurality of transmissions lines 214 and the input electrode 206 and the output electrode 208 and the top ground plane 210 and the bottom ground plane 212. Stated another way, the floating element 202 is isolated from the transmission lines 214 and is placed on a layer 204E dedicated exclusively to the printed pattern of the floating element 202.

Transmission lines 214 may be placed inside a multilayer ceramic package 200 structure by a variety of different techniques. In a preferred embodiment, both the transmission lines 214 and the floating element 202 will be screen printed onto dielectric ceramic substrates and will consist of a conductive paste material. The printed transmission lines 214 will be spaced using conventional lines and spacings standard to the industry.

Although the floating element 202 may be used to adjust coupling between many different types of elements embedded inside a multilayer ceramic package, in a preferred embodiment, the floating element 202 will be used to adjust coupling between the transmission lines which form the resonant cavities of a filter device. Typically, resonant structures (resonant cavities) may be formed from coiled transmission lines which are wound through the various layers of a multilayer package. This provides a simple design and the coiled transmission lines may save space in the multilayer package. Thus, substantially helical transmission lines are oftentimes used to form the resonant structures.

The floating element 202 of the present invention is ideally suited to coupling such helical transmission line resonant structures because of the real estate that becomes available when transmission lines are wound through a package, A helical transmission line design provides an area on each dielectric substrate, away from the transmission lines 214, where it is possible to strategically place the floating element 202. Of course, the floating element is not limited to being used exclusively with helical resonant structures, but can be applied to any structure formed using multilayer technologies.

Another design option involves the use of multiple floating elements, vertically aligned throughout the multilayer package, to provide still further coupling between the transmission lines. As such, in one embodiment of the present invention, a plurality of substantially rectangular floating elements may be placed vertically aligned through the plurality of dielectric layers, each floating element doing a small part in adjusting the overall coupling between the embedded transmission lines. The purpose of the floating element 202 in the multilayer package 200 is primarily to adjust the coupling of the transmission lines. The exact manner in which this may be achieved may be very design specific. The exact placement of the floating element 202, and even the shape and dimensions of the floating element itself, will depend of the specific design considerations of the multilayer ceramic package design, the intended application, the required specifications, the circuit, and other design criteria.

Figure 3:
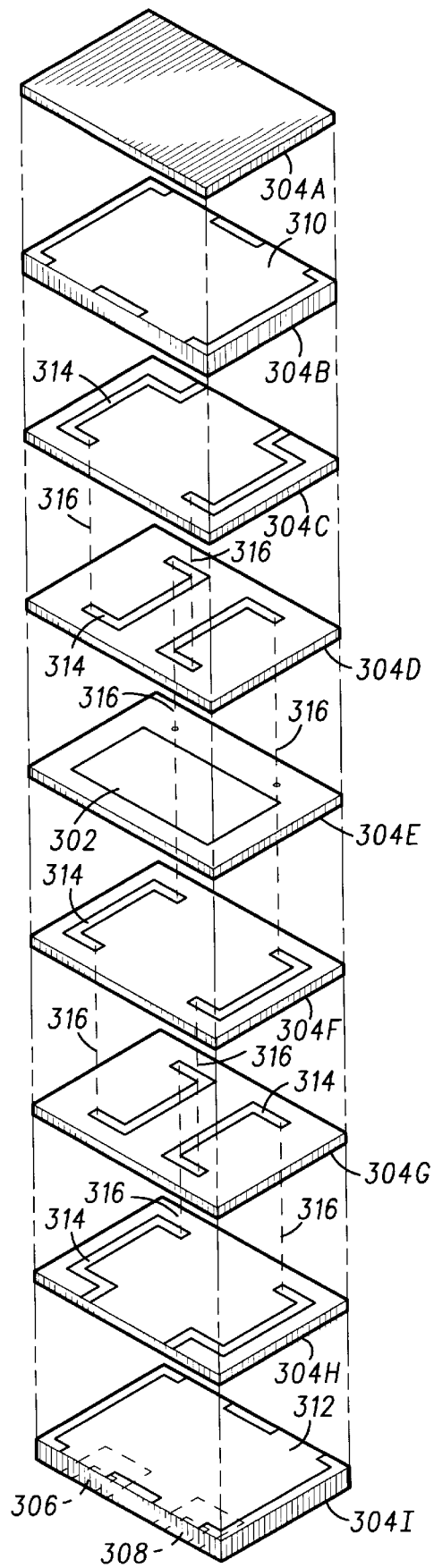
FIG. 3 shows another embodiment of a multilayer ceramic package with a floating element to couple transmission lines in accordance with the present invention.

Moreover, just as the transmission line patterns may be dictated by design considerations, so to may the floating element pattern be varied according to design consideration. For example, in the embodiment of the present invention shown in FIG. 2, the floating element 202 is substantially a rectangular strip. In FIG. 3, the floating element is more substantially square shaped.

FIG. 3 shows another embodiment of a multilayer ceramic package 300 wherein a floating element 302 to couple transmission lines is provided. Referring to FIG. 3, a multilayer ceramic package 300 with a floating element 302 to adjust the coupling between the transmission lines is provided. In FIG. 3, a multilayer ceramic package 300 having a series of dielectric ceramic layers labeled 304A through 304I respectively is provided. An input electrode 306 is formed on a bottom surface of one of the dielectric layers 304I. An output electrode 308 is also formed on a bottom surface of dielectric layer 304I. Additionally, a top ground plane 310 is formed on a surface of dielectric layer 304B and a bottom ground plane 312 is formed on a surface of dielectric layer 304I.

Transmission lines 314 are strategically placed on the layers inside the multilayer ceramic package 300. The transmission lines may also be referred to as electrodes formed on the dielectric ceramic layers 304A–304H. A series of through holes (not shown) are typically punched into the dielectric layers 304A–304I and metallized with a conductive material to connect the transmission lines 314. The through holes are not shown in the figures as they would unnecessarily complicate the figures and are not needed to understand the present invention. Moreover, dashed lines 316 show where the transmission lines are interconnected between adjacent layers of dielectric ceramic.

In FIG. 3, the transmission lines 314 are printed in a substantially helical pattern beginning on layer 304H and extending through layer 304C to provide a pair of resonant structures which provide a two pole bandpass filter. A floating element 302 is provided on layer 304E to adjust the electrical coupling between the transmission lines 314. The floating element 302 is spatially separated from the plurality of transmissions lines 314 and the input electrode 306 and the output electrode 308 and the top ground plane 310 and the bottom ground plane 312. Stated another way, the floating element 302 is isolated from the transmission lines 314 and is placed on a layer 304E dedicated exclusively to the printed pattern of the floating element.

In the embodiment shown in FIG. 3, one should note that the floating element 302 has a substantially square shape. This may provide greater coupling than the coupling element 202 of FIG. 2. Additionally, this embodiment further illustrates how the shape, dimensions, and positioning of the floating element 302 may be varied for different sets of design criteria. Moreover, this embodiment also shows how the pattern of the floating element 302 may be substantially of greater area than the transmission lines 314 on the other layers of the multilayer ceramic package 300.

In the design of certain multilayer or microstrip or stripline type structures, it is not unusual to find a printed resonator pattern which is isolated from the other transmission lines in the device. However, in those instances, the printed pattern itself forms the resonant structure. This is readily distinguishable from the present invention wherein the resonant structures are formed from the transmission lines themselves and the floating element serves an entirely different purpose, namely to adjust the coupling between the resonant cavities.

Figure 4:
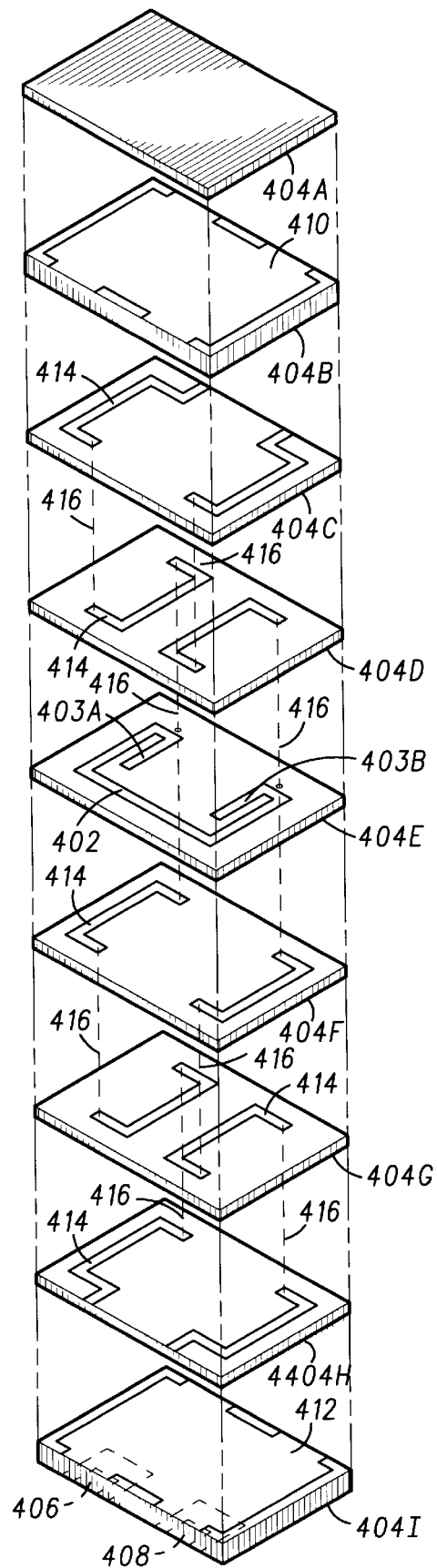
FIG. 4 shows another embodiment of a multilayer ceramic package with a floating element to couple transmission lines in accordance with the present invention.

FIG. 4 shows still another embodiment of a multilayer ceramic package 400 wherein a floating element 402 to adjust the coupling between the transmission lines 414 is provided. Referring to FIG. 4, a multilayer ceramic package 400 having a series of dielectric ceramic layers labeled 404A through 404I respectively is provided. An input electrode 406 is formed on a bottom surface of one of the dielectric layers 404I. An output electrode 408 is also formed on a bottom surface of dielectric layer 404I. Additionally, a top ground plane 410 is formed on a surface of dielectric layer 404B and a bottom ground plane 412 is formed on a surface of dielectric layer 404I.

Transmission lines 414 are strategically placed on the layers inside the multilayer ceramic package 400. The transmission lines may also be referred to as electrodes formed on the dielectric ceramic layers 404A–404H. A series of through holes (not shown) are typically punched into the dielectric layers 404A–404I and metallized with a conductive material to connect the transmission lines 414. The through holes are not shown in the figures as they would unnecessarily complicate the figures and are not needed to understand the present invention. Moreover, dashed lines 416 show where the transmission lines are interconnected between adjacent layers of dielectric ceramic.

In FIG. 4, the transmission lines 414 are printed in a substantially helical pattern beginning on layer 404H and extending through layer 404C to form a pair of resonant structures which provide a two pole bandpass filter. A floating element 402 is provided on layer 404E to adjust the electrical coupling between the transmission lines 414. The floating element 402 is spatially separated from the plurality of transmissions lines 414 and the input electrode 406 and the output electrode 408 and the top ground plane 410 and the bottom ground plane 412. Stated another way, the floating element 402 is isolated from the transmission lines 414 and is placed on a layer 404E dedicated exclusively to the printed pattern of the floating element.

FIG. 4 is provided to show still another interesting configuration of the floating element 402. In this embodiment, the floating element 402 contains additional members 403A and 403B at the ends thereof and extending in a substantially coiled manner on dielectric sheet 404E. The additional members serve an important purpose of further manipulating the coupling between the transmission lines 414.

Whereas the floating element of the present invention may typically adjust the electrical capacitive coupling between resonant cavities, still another aspect of the present invention involves the addition of members (403A and 403B) to the ends of the floating element 402 to effect the inductive coupling between the resonators. Stated another way, the floating element 402 may wrap around into a U-shaped pattern, or it may be coiled at its ends to provide additional coupling. When the floating element 402 has coiled members (403A and 403B) at the ends thereof, the inductive coupling is effected. FIG. 4 provides an example of a floating element 402 with coiled members (403A and 403B) extending from the ends thereof on dielectric sheet 404E of ceramic.

Figure 5:
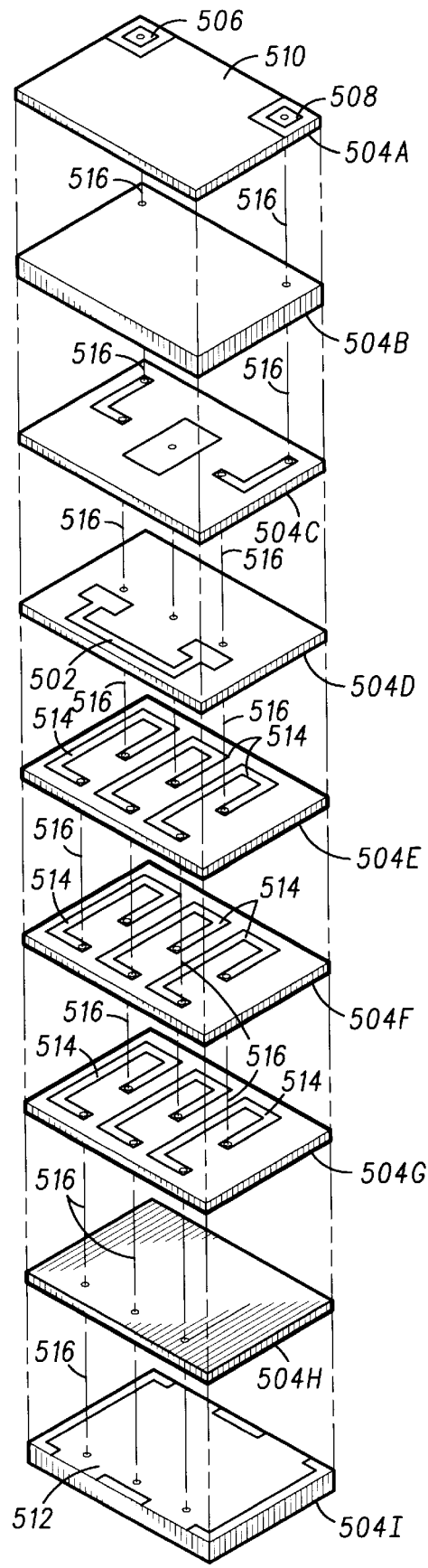
FIG. 5 shows an embodiment of a multilayer ceramic package with a floating element to couple non-adjacent resonator transmission lines in accordance with the present invention.

Another important aspect of the present invention is the use of the floating element to couple non-adjacent resonant cavities. This is shown in FIG. 5 and described below. Since resonant cavities may be typically aligned longitudinally inside a multilayer package, the floating element is uniquely qualified to couple non-adjacent resonators, namely a first and a third resonant cavity for example, by merely extending past a middle resonant cavity. This is a very valuable design tool because it allows greater flexibility in the frequency response curve of the filter. Stated another way, the frequency response curve of a filter may be drastically altered by strategic placement of a floating element without increasing the size of the multilayer package.

FIG. 5 shows an embodiment of a multilayer ceramic package 500 with a floating element 502 to couple non-adjacent resonator transmission lines. Referring to FIG. 5, a multilayer ceramic package 500 with a floating element 502 to adjust the coupling between the transmission lines is provided. In FIG. 5, a multilayer ceramic package 500 having a series of dielectric ceramic layers labeled 504A through 504I respectively is provided. An input electrode 506 is formed on a top surface of one of the dielectric layers 504A. An output electrode 508 is also formed on a top surface of dielectric layer 504A. Additionally, a top ground plane 510 is formed on a surface of dielectric layer 504A and a bottom ground plane 512 is formed on a surface of dielectric layer 504I.

Transmission lines 514 are strategically placed on the layers 504C, 504E, 504F and 504G inside the multilayer ceramic package 500. The transmission lines may also be referred to as electrodes formed on the dielectric ceramic layers 504A–504H. A series of through holes (not shown) are typically punched into the dielectric layers 504A–504I and metallized with a conductive material to connect the transmission lines 514. The through holes are not shown in the figures as they would unnecessarily complicate the figures and are not needed to understand the present invention. Moreover, dashed lines 516 show where the transmission lines are interconnected between adjacent layers.

In FIG. 5, the transmission lines 514 are printed in a pattern to form three helical structures beginning on layer 304E and extending through layer 304G to provide three resonant structures positioned longitudinally across the sheets 504E, 504F and 504G of dielectric ceramic. These three substantially helical shaped structures provide a three pole bandpass filter. A floating element 502 is provided on layer 504E to adjust the electrical coupling between the transmission lines 514. The floating element 502 is spatially separated from the plurality of transmissions lines 514 and the input electrode 506 and the output electrode 508 and the top ground plane 510 and the bottom ground plane 512. Stated another way, the floating element 502 is isolated from the transmission lines 514 and is placed on a layer 504D dedicated exclusively to the printed pattern of the floating element. FIG. 5 shows the applicability of the floating element concept applied to non-adjacent resonators, a valuable tool for mulilayer package designers.

An important feature of the present invention is the fact that the floating element cannot be directly in contact with any other metallized surfaces of the multilayer package. The fact that the element is not in such contact provides its "floating" nature. More specifically, the floating element cannot be in direct contact with any other transmission line, ground plane, or input/output port. Any such contact would undesirably effect the performance of the filter or component such that the desired coupling may not be achieved.

To fully appreciate the significance of the floating element and its positive effect relative to transmission line and filter design, a cursory review of transmission line theory may be required. This understanding may also serve to explain the graphs provided in FIGS. 6–8 discussed below.

It has been shown (Jones E. M. T. and Bolljahn J. T. "Coupled Transmission Line Filters and Directional Couplers", Trans. I.R.E. MTT-4, p. 75 (1956).) that in electromagnetically coupled transmission lines, the output power ($P_2$) coupled into a second line when input power ($P_1$) is incident on the first line is given by:

$$P_2 = \frac{P_1 \cdot k^2 \sin^2 \theta}{1 - k^2 \cos^2 \theta}$$

(equation 1.1) where ($\theta$) is the electrical length over which the transmission lines are electromagnetically coupled and (k) is the Coupling Coefficient of the transmission lines. Referring to equation 1.1, the coupled or output power ($P_2$) will be at its maximum at a center frequency ($f_c$) where the electrical length is ninety degrees (90°) and the frequency response curve has greater attenuation (rolls off) at frequencies above and below ($f_c$). This is true for all cases when (k) is constant.

A coupling bandwidth is the frequency range over which the coupled power is greater than some specified value, usually half its peak value, or in equation form:

$$BW_{-3dB} = f_2 - f_1$$

(equation 1.2) where ($f_2$) and ($f_1$) are the upper and lower frequencies, respectively, and where ($P_2$) falls to (−3 dB) of its peak value at ($f_c$) When (k) is constant and when (k) is independent of frequency, the bandwidth is a simple function of (k). However, in the cases where (k) is a function of the frequency, k(f), the frequency response curve of ($P_2$) may be drastically altered in shape. For example, if k(f) goes through a minimum at some frequency ($f_{min}$), then ($P_2$) at ($f_{min}$) will show a sharp dropoff or zero in the frequency response curve waveform (see FIG. 8).

These same concepts and principles may be extended to microwave filter designs that comprise two or more coupled transmission lines or resonators. The Coupling Coefficient (k), in large part, determines the shape of the filter's frequency response curve. By careful adjustment of the Coupling Coefficient (k), the filter can be tailored to meet specific requirements. Moreover, the floating element of the present invention provides a mechanism for adjusting the coupling of these transmission lines, and ultimately effects the performance characteristics of the filter. In a preferred embodiment, the present invention describes a simple technique, namely the strategic placement of a floating element, to adjust the Coupling Coefficient (k) between resonant structures in a multilayer ceramic filter.

Although it may be possible to insert the floating element on any layer of a ceramic multilayer package, including a layer already having printed transmission lines, in a preferred embodiment, the floating element will be isolated on its own dielectric sheet. As such, having a single layer dedicated exclusively to the floating element (and transmission line via through holes) provides desirable isolation and improved coupling. Moreover, since the floating element uses the same materials and deposition techniques as the transmission lines of the package, incorporation of the floating element layer into the package design is easily achieved.

It is important to note that the floating element is not merely another transmission line in the multilayer package. To see the effect that the floating element has on the properties of the package, refer to FIG. 6 which shows a graph of the coupling between resonator transmission lines both with and without a floating element in accordance with the present invention.

Figure 6:
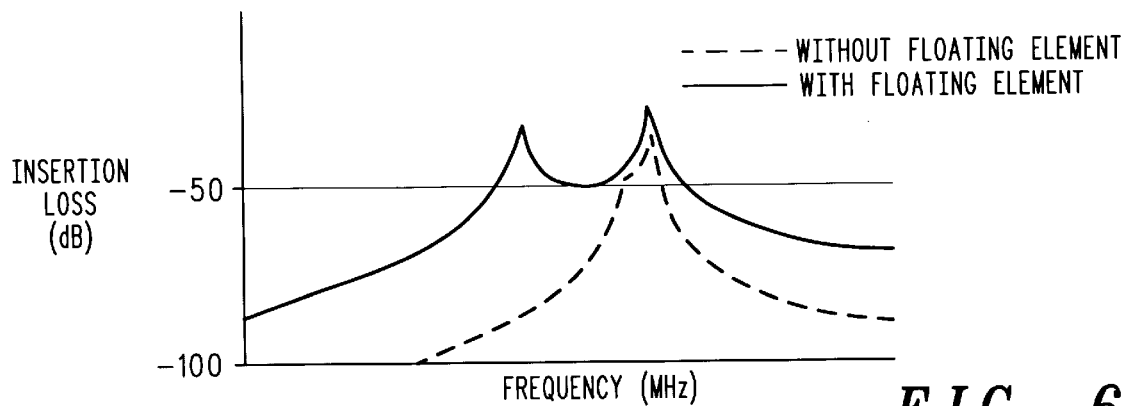
FIG. 6 shows a graph of the coupling between resonator transmission lines both with and without a floating element in a structure simulation in accordance with the present invention.

As is shown in FIG. 6, coupling is increased dramatically with the addition of the floating element. In FIG. 6, the dashed line represents the coupling of resonator transmission lines before the floating element is designed into the package. The solid line represents the coupling of the resonator transmission lines after the floating element is designed into the multilayer package. In FIG. 6, the amount of separation between the peaks is proportional to the amount of coupling between the transmission lines. Thus, when the floating element is incorporated into the multilayer package design, coupling is increased, and the peaks become separated. Referring again to FIG. 6, Insertion Loss, measured in dB, is provided along the y-axis, and Frequency, measured in mega-hertz, is measured along the x-axis. FIG. 6 is provided to show how the floating element (202, 302, 402 and 502) effects the coupling of transmission lines in a multilayer package. The solid line, which represents the floating element design, has greater coupling between the transmission lines.

Figure 7:
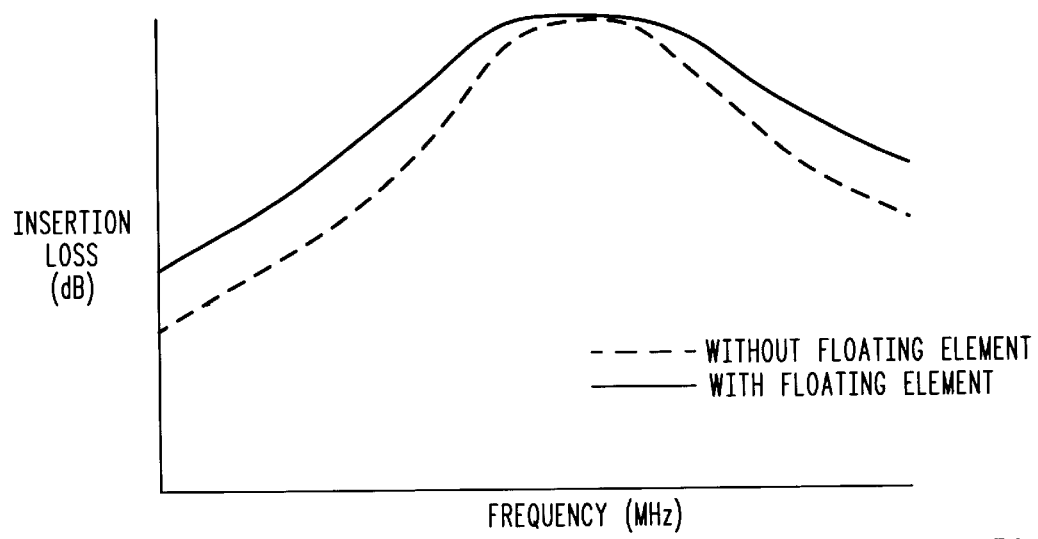
FIG. 7 shows a circuit simulation of a frequency response curve for a multilayer bandpass filter package both with and without a floating element in accordance with the present invention.

Another desirable effect of the floating element feature applied to one specific filter design is shown in FIG. 7. Referring to FIG. 7, it is shown that the addition of the floating element actually increases the operable passband of a filter frequency response curve. FIG. 7 shows a frequency response curve for a multilayer bandpass filter package both with and without a floating element in accordance with the present invention. A plot of the frequency response for a multilayer package without a floating element is shown as a dashed line in FIG. 7. A plot of the frequency response for a multilayer package with a floating element is shown as a solid line in FIG. 7. Notably, the introduction of a floating element increases the operable passband of the frequency response.

FIG. 7 shows a circuit simulation for a filter design with coupled resonators. One effect of the increased coupling between the transmission lines is that the passband for one specific filter design is increased or broadened. This is achieved by the strategic placement of a properly designed floating element between the resonators in a multilayer filter package design.

A wider passband may be desirable for certain telecommunication applications. For example, a wider passband may meet the design specifications of a certain bandwidth for a cellular telephone application (analog cellular, digital cellular, or personal communication system frequencies for example). It is because of the modified coupling, achieved through the introduction of the floating element, that the increased passband is achieved. Referring to FIG. 7, Insertion Loss, measured in dB, is provided along the y-axis, and Frequency, measured in mega-hertz, is measured along the x-axis.

Figure 8:
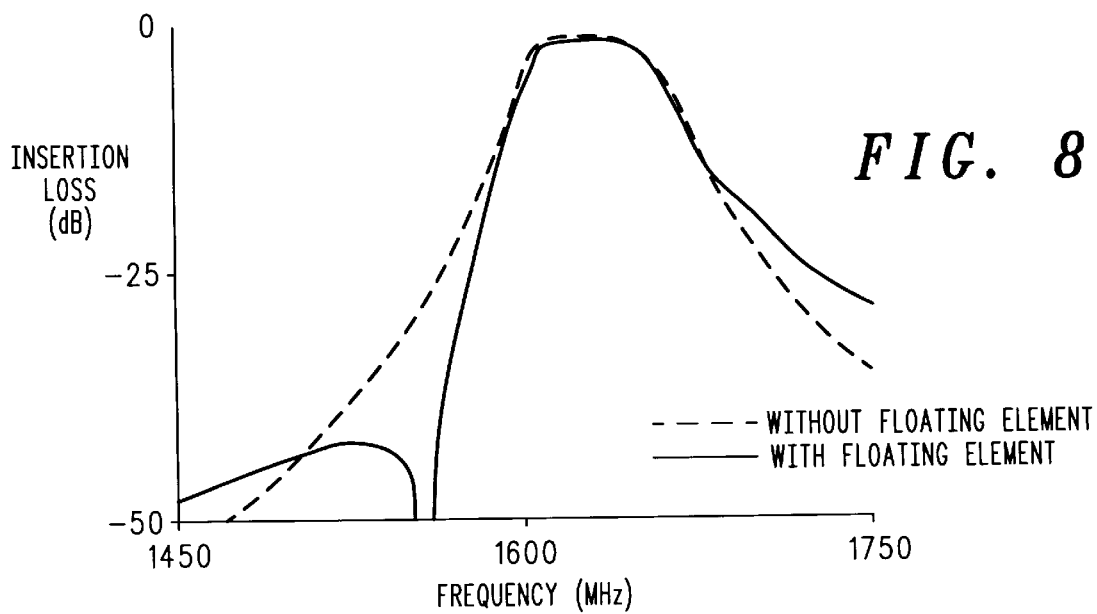
FIG. 8 shows a circuit simulation of a frequency response curve for a multilayer bandpass filter package both with and without a floating element that provides a low-side transmission zero in accordance with the present invention.

FIG. 8 shows the effect of the floating element in another specific multilayer filter design. In FIG. 8, the floating element has the effect of creating a low-side zero in the frequency response curve of the multilayer filter. FIG. 8 shows a circuit simulation of a filter design having a low-side transmission zero. Referring to FIG. 8, the dashed line represents the frequency response curve for a filter design without the floating element. The solid line in FIG. 8 represents the frequency response curve for a filter design with the floating element strategically incorporated into the mulilayer filter package design. On the low side of the passband, the solid line drops precipitously whereas the dashed line merely tapers downward with a gradual slope. A custom filter application, such as a cellular telephone for example, may have specifications which require a sharp drop-off similar to that provided by the solid line. In such an instance, the floating element design could allow a designer to meet a more stringent and demanding specification. FIG. 8 shows another advantage of the floating element design.

Referring to FIG. 8, Insertion Loss, measured in dB, is provided along the y-axis, and varies between zero (0) and (−50 dB). Frequency, measured in mega-hertz, is measured along the x-axis and varies between 1450 MHz and 1750 MHz and has a center frequency of approximately 1625 Mhz. The numerical values provided for the axes in FIG. 8 are representative only, and the low-side transmission zero effect could be achieved at other frequencies.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A multilayer ceramic bandpass filter, comprising:
   a plurality of dielectric layers, including:
      an input electrode formed on a surface of one of the dielectric layers;
      an output electrode formed on a surface of one of the dielectric layers;
      a top ground plane formed on a surface of one of the dielectric layers;
      a bottom ground plane formed on a surface of one of the dielectric layers;
   a plurality of transmission lines defining at least two helical resonant structures, each resonant structure including:
      a plurality of coiled electrodes formed on the plurality of dielectric layers;
      a plurality of metallized through holes formed in the plurality of dielectric layers and the plurality of transmission lines electrically connected with each other by the plurality of metallized through holes so as to define the at least two helical resonant structures;
   an electrically floating element to adjust the electrical coupling between the at least two resonant structures, the floating element extending within each resonant structure.

2. The multilayer ceramic bandpass filter of claim 1, wherein the floating element further comprises coiled members at an end thereof to provide inductive coupling to the resonant structures.

3. The multilayer ceramic bandpass filter of claim 1, wherein the floating element is substantially rectangular and widens a passband of a filter response of the bandpass filter.

4. The multilayer ceramic bandpass filter of claim 1, wherein the plurality of transmission lines and the floating element comprise a printed conductive paste material.

5. The multilayer ceramic bandpass filter of claim 1, further comprising a plurality of floating elements vertically aligned through the plurality of dielectric layers.

6. The multilayer ceramic bandpass filter of claim 1, wherein the floating element incorporates a via passing vertically through the plurality of dielectric layers.

7. The multilayer ceramic bandpass filter of claim 1, wherein the floating element increases a coupling coefficient between the at least two resonant structures.

8. The multilayer ceramic bandpass filter of claim 1, wherein the floating element increases a capacitive coupling between the at least two resonant structures.

9. The multilayer ceramic bandpass filter of claim 1, wherein the floating element provides a low-side transmission zero in a frequency response curve of the bandpass filter.

10. A multilayer ceramic bandpass filter, comprising:
    a plurality of dielectric layers, including:
       an input electrode formed on a surface of one of the dielectric layers;
       an output electrode formed on a surface of one of the dielectric layers;
       a top ground plane formed on a surface of one of the dielectric layers;
       a bottom ground plane formed on a surface of one of the dielectric layers;
    a plurality of transmission lines defining a first resonant structure and a second resonant structure and a third resonant structure spaced longitudinally within the plurality of dielectric layers such that the first and third resonant structures are nonadjacent, each resonant structure including:
       a plurality of coiled electrodes formed on the plurality of dielectric layers;
       a plurality of metallized through holes formed in the plurality of dielectric layers and the plurality of coiled electrodes, the coiled electrodes being connected with each other by the plurality of metallized through holes;
    a substantially rectangular electrically floating element capacitively couples to the first and third resonant structures so as to adjust the electrical coupling between the first resonant structure and the third resonant structure, the substantially rectangular floating element extending within each resonant structure.

11. The multilayer ceramic bandpass filter of claim 10, wherein the substantially rectangular floating element widens a passband of a filter response of the bandpass filter.

12. The multilayer ceramic bandpass filter of claim 10, wherein the plurality of transmission lines and the substantially rectangular floating element comprise a printed conductive paste material.

13. The multilayer ceramic bandpass filter of claim 10, further comprising a plurality of substantially rectangular floating elements vertically aligned through the plurality of dielectric layers.

14. The multilayer ceramic bandpass filter of claim 10, wherein the substantially rectangular floating element incorporates a via passing vertically through the plurality of dielectric layers.

15. The multilayer ceramic bandpass filter of claim 10, wherein the substantially rectangular floating element increases a coupling coefficient between the first resonant structure and the third resonant structure.

16. The multilayer ceramic bandpass filter of claim 10, wherein the substantially rectangular floating element further comprises coiled members at each end thereof to provide inductive coupling to the first resonant structure and the third resonant structure.

17. The multilayer ceramic bandpass filter of claim 10, wherein the substantially rectangular floating element provides a low-side transmission zero in a frequency response curve of the bandpass filter.

* * * * *